(12) United States Patent
Shih et al.

(10) Patent No.: US 9,442,368 B2
(45) Date of Patent: *Sep. 13, 2016

(54) METHOD OF MAKING AN EXTREME ULTRAVIOLET PELLICLE

(71) Applicant: Taiwan Semiconductor Manufacturing Co., Ltd., Hsin-Chu (TW)

(72) Inventors: Chih-Tsung Shih, Hsinchu (TW); Tien-Hsi Lee, Zhongli (TW); Chia-Jen Chen, Jhudong Township (TW); Shang-Chieh Chien, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/980,469

(22) Filed: Dec. 28, 2015

(65) Prior Publication Data

US 2016/0109798 A1 Apr. 21, 2016

Related U.S. Application Data

(63) Continuation of application No. 14/259,194, filed on Apr. 23, 2014, now Pat. No. 9,256,123.

(51) Int. Cl.
*G03F 1/64* (2012.01)
*B29C 71/02* (2006.01)
*G03F 7/20* (2006.01)

(52) U.S. Cl.
CPC .............. *G03F 1/64* (2013.01); *B29C 71/02* (2013.01); *G03F 7/2002* (2013.01); *B29C 2071/022* (2013.01)

(58) Field of Classification Search
CPC ....... G03F 1/64; G03F 7/2002; B29C 71/02; B29C 2071/022

USPC .......................................................... 430/5
See application file for complete search history.

(56) References Cited

U.S. PATENT DOCUMENTS

| 5,374,564 A | 12/1994 | Bruel |
| 6,623,893 B1 | 9/2003 | Levinson et al. |
| 7,723,704 B2 | 5/2010 | Wood et al. |
| 2012/0183757 A1 | 7/2012 | Akiyama et al. |

FOREIGN PATENT DOCUMENTS

| EP | 2477072 A1 | 7/2012 |
| JP | 2012151158 | 9/2012 |

OTHER PUBLICATIONS

Takao Yonehara and Kiyofumi Sakaguchi, "ELTRAN®; Novel SOI Wafer Technology," Japan Society of Applied Physics International, Jul. 2001, No. 4, p. 10-16.
Pawitter Mangat, et al., "EUV Pellicles__An Urgent Need or Wishful Want?," Globalfoundries PowerPoint, Sep. 30, 2012, p. 1-12.
Yashesh A. Shroff, et al., "Progress in high transmission pellicles for EUVL," EUVL Symposium, 2007, p. 1-17.
Notice of Allowance dated Sep. 25, 2015 for U.S. Appl. No. 14/259,194.

*Primary Examiner* — Christopher Young
(74) *Attorney, Agent, or Firm* — Eschweiler & Associates, LLC

(57) ABSTRACT

The present disclosure relates to a method of forming an extreme ultraviolet (EUV) pellicle having an pellicle film connected to a pellicle frame without a supportive mesh, and an associated apparatus. In some embodiments, the method is performed by forming a cleaving plane within a substrate. A pellicle frame is attached to an upper surface of the substrate, and the substrate is cleaved along the cleaving plane to form a pellicle film attached to the pellicle frame. The method forms the pellicle without using a support structure, which may block EUV radiation and cause substantial non-uniformities in the intensity of EUV radiation incident on an EUV reticle.

20 Claims, 5 Drawing Sheets

METHOD OF MAKING AN EXTREME ULTRAVIOLET PELLICLE

REFERENCE TO RELATED APPLICATION

This Application is a Continuation of U.S. application Ser. No. 14/259,194 filed on Apr. 23, 2014, the contents of which are incorporated by reference in their entirety.

BACKGROUND

Extreme ultraviolet lithography (EUVL) is a promising next-generation lithography solution for emerging technology nodes. Integrated chips formed using EUVL will have minimum feature sizes of less than 32 nanometers. Such small feature sizes allow contaminants (e.g., dust, airborne microbes, chemical vapors, etc.) to damage integrated chips during fabrication. To prevent such contaminants from damaging integrated chips, integrated chips are fabricated in clean rooms having low levels of contaminants.

However, even the best clean rooms still contain contaminants that can fall on a lithography reticle and cause defects. To prevent such contamination of a reticle, many lithography systems use pellicles. Pellicles are optically transmitting thin films (i.e., membranes) that are disposed over a reticle to provide protection from the effects of particulate contamination by preventing contaminant particles from landing on a reticle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
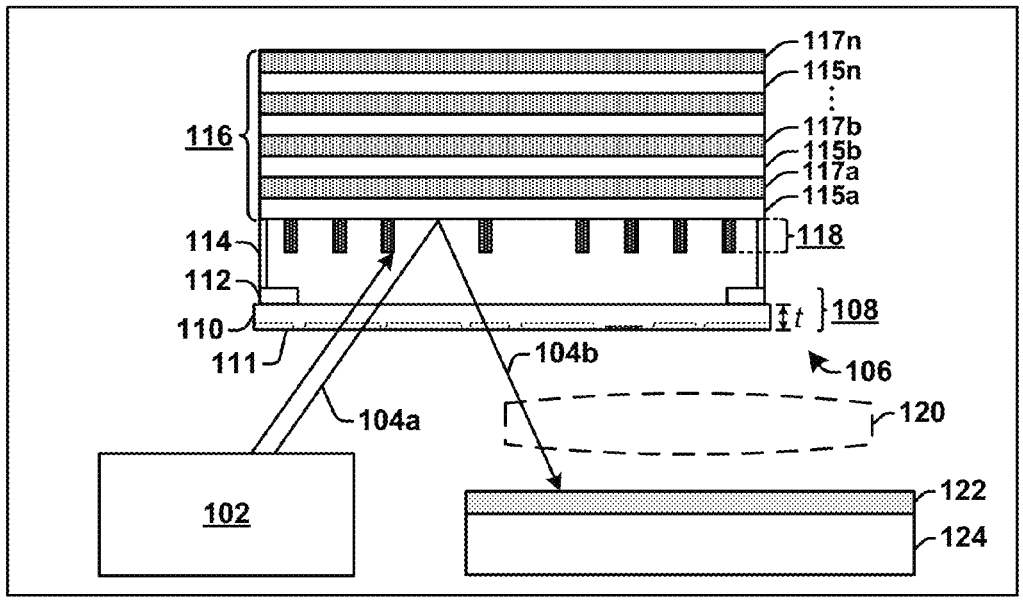
FIG. 1 illustrates a block diagram of some embodiments of an extreme ultraviolet lithography (EUVL) system having a pellicle connected to an EUV reticle.

The following disclosure provides many different embodiments, or examples, for implementing different features of the disclosure. Specific examples of components and arrangements are described below to simplify the present provided subject matter. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet radiation (i.e., radiation having wavelengths between 124 nm and 10 nm) is among the most highly absorptive radiation of the electromagnetic spectrum. Due to the high absorption of EUV radiation, pellicles used in extreme ultraviolet lithography (EUVL) systems use very thin, slack-free films having a constant tension that allow for a high rate of optical transmission. To successfully implement thin films that have a constant tension, a selected film may be supported by a support structure that extends over an EUV reticle.

The support structure used to support a thin film may comprise a mesh structure, having a plurality of hexagon or square openings (e.g., a honeycomb structure) that allow for transmission of EUV radiation. However, it has been appreciated that due to the high absorption of EUV radiation, the mesh of a support structure may also block EUV radiation and cause substantial non-uniformities in the intensity of EUV radiation incident on an EUV reticle.

Accordingly, the present disclosure relates to a method of forming an EUV pellicle comprising an high quality, optically transmissive pellicle film connected to a pellicle frame without a supportive mesh, and an associated apparatus. In some embodiments, the method is performed by forming a cleaving plane within a substrate at a position parallel to a top surface of the substrate. A pellicle frame is attached to the top surface of the substrate. The substrate is cleaved along the cleaving plane to form a pellicle film comprising a thinned substrate coupled to the pellicle frame. Prior to cleaving the substrate, the substrate is operated upon to reduce structural damage to the top surface of substrate during formation of the cleaving plane and/or during cleaving the substrate. By operating upon the substrate to reduce structural damage to the top surface of substrate during formation of the cleaving plane and/or during cleaving the substrate, degradation (e.g., braking) of the thinned substrate during cleaving is prevented thereby improving the durability of the thinned substrate and removing a need for a support structure.

FIG. 1 illustrates a block diagram of some embodiments of an extreme ultraviolet lithography (EUVL) system 100.

The EUVL system 100 comprises a radiation source 102 configured to emit extreme ultraviolet (EUV) radiation 104 (e.g., having wavelengths in a range of about 10 nm to about 130 nm). The emitted EUV radiation 104 is supplied as incident EUV radiation 104a to a patterning element 106. The patterning element 106 is configured to reflect the incident EUV radiation 104a, as reflected EUV radiation 104b, to one or more optical elements 120. The one or more optical elements 120 are configured to focus the reflected EUV radiation 104b in a manner that selective patterns a light sensitive photoresist material 122 disposed over a semiconductor workpiece 124.

The patterning element 106 comprises an EUV pellicle 108, which is mounted over an EUV reticle 116 by way of a pellicle frame 114. The EUV reticle 116 comprises a plurality of reflective layers 115a-115n separated by a plurality of spacer layers 117a-117n. In some embodiments, the reflective layers 115a-115n may comprise molybdenum (Mo) or ruthenium (Ru) and the spacer layers 117a-117n may comprise silicon (Si). The reflective layers 115a-115n are configured to reflect incident EUV radiation 104a by means of Bragg interference between multi-interlayer interference formed between the reflective and spacer layers, 115a-115n and 117a-117n, respectively. For example, a ray of incident EUV radiation 104a may be partially reflected at a first interlayer interface formed between a first reflective layer 115a and a first spacer layer 117a and partially reflected at a second interlayer interface formed between a second reflective layer 115b and a second spacer layer 117b.

The EUV pellicle 108 comprises a pellicle film comprising a thinned substrate 110, which is connected to the pellicle frame 114 by way of an adhesive material 112. The adhesive material 112 may be disposed between the thinned substrate 110 and the pellicle frame 114 along outer edges of the pellicle frame 114, so that the adhesive material 112 does not interfere with the incident or reflected EUV radiation, 104a or 104b. The thinned substrate 110 is configured to prevent contaminant particles from landing on the EUV reticle 116 and degrading the EUVL system 100 (e.g., by keeping contaminant particles away from a plane of focus of the EUV reticle 116).

The thinned substrate 110 comprises an unbroken film having a substantially uniform thickness t between the adhesive material 112. In some embodiments, the thinned substrate 110 may have a thickness t having a range of between approximately 50 nm and approximately 200 nm. The unbroken thinned substrate 110 provides for a high quality pellicle film (i.e., membrane) that is able to be attached to the pellicle frame 114 without using a support structure that may interfere with the incident or reflected EUV radiation, 104a or 104b.

In various embodiments, the thinned substrate 110 may comprise crystalline silicon having a homogenous crystalline framework. In other embodiments, the thinned substrate 110 may comprise a material having a high Young's modulus (e.g., greater than 750 GPa) such as carbon nanotubes (having a Young's modulus of approximately 1,000 GPa), graphene (having a Young's modulus of approximately 1,000 GPa), or diamond (having a Young's modulus of approximately 1,220 GPa). In some embodiments, the thinned substrate 110 may comprise a material having a high Young's modulus abutting a silicon layer disposed along a bottom surface 111 of the thinned substrate 110 opposing the pellicle frame 114. In some embodiments, the thinned substrate 110 may comprise hydrogen and boron dopants. The hydrogen and boron dopants comprise a peak concentration disposed along the bottom surface 111 of the thinned substrate 110. In some embodiments, the hydrogen dopants may comprise hydrogen molecules ($H_2$) and/or hydrogen ions (H+).

Figure 2:
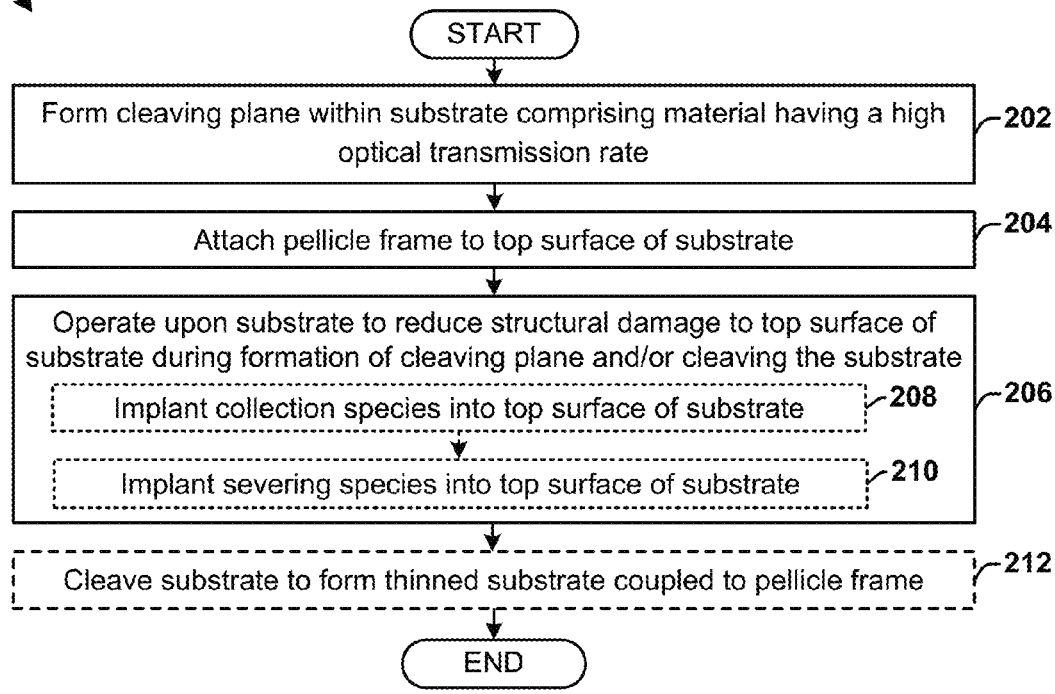
FIG. 2 is a flow diagram of some embodiments of a method of forming a pellicle for an EUV reticle.

FIG. 2 is a flow diagram of some embodiments of a method 200 of forming a pellicle for an extreme ultraviolet (EUV) reticle.

While the disclosed methods (e.g., method 200 and/or 300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a cleaving plane is formed within a substrate comprising a material having a high optical transmission rate. In some embodiments, the substrate may comprise a silicon substrate of crystalline silicon. In other embodiments, the substrate may comprise a material having a high Young's modulus (e.g., greater than 750 GPa) such as carbon nanotubes (e.g., single-walled carbon nanotubes), graphene, or diamond.

At 204, a pellicle frame is attached to a top surface of the substrate.

At 206, the substrate is operated upon to reduce structural damage (e.g., prevent breaking of the thinned substrate) to the top surface of substrate during formation of the cleaving plane and/or during cleaving the substrate (act 212).

In some embodiments, structural damage to the top surface of substrate may be reduced by forming the cleaving plane using a collector species and a severing species. For example, at 208, a collection species (e.g., boron), having a depth that is easily controlled, may be implanted into a top surface of a substrate. A severing species (e.g., hydrogen), configured weaken the substrate, is subsequently implanted into the top surface of the substrate, at 210. The severing species is drawn to the collection species, concentrating the severing species in a peak concentration along a horizontal cleaving plane extending parallel to the top surface of the substrate.

In other embodiments, structural damage to the top surface of substrate may be reduced by attaching the pellicle frame to the top surface of the substrate using a temporary adhesive material and a perdurable adhesive material. The temporary adhesive material is configured to improve adhesion between the pellicle frame and the substrate so that damage to the substrate is reduced during cleaving.

At 212, the substrate is cleaved along the cleaving plane to reduce a thickness of the substrate and to form a pellicle film comprising a thinned substrate coupled to the pellicle frame. In some embodiments, the thinned substrate may have a thickness having a range of between approximately 50 nm and approximately 150 nm, for example. After the substrate is cleaved, the temporary adhesive material may be removed.

Therefore, method 200 operates upon the substrate to reduce damage to the thinned substrate used in the EUV pellicle. By reducing damage to the thinned substrate during formation, the thinned substrate has a structural integrity that allows thinned substrate to act as a pellicle film (i.e., membrane) without using a support structure that may generate non-uniformities in EUV radiation.

Figure 3:
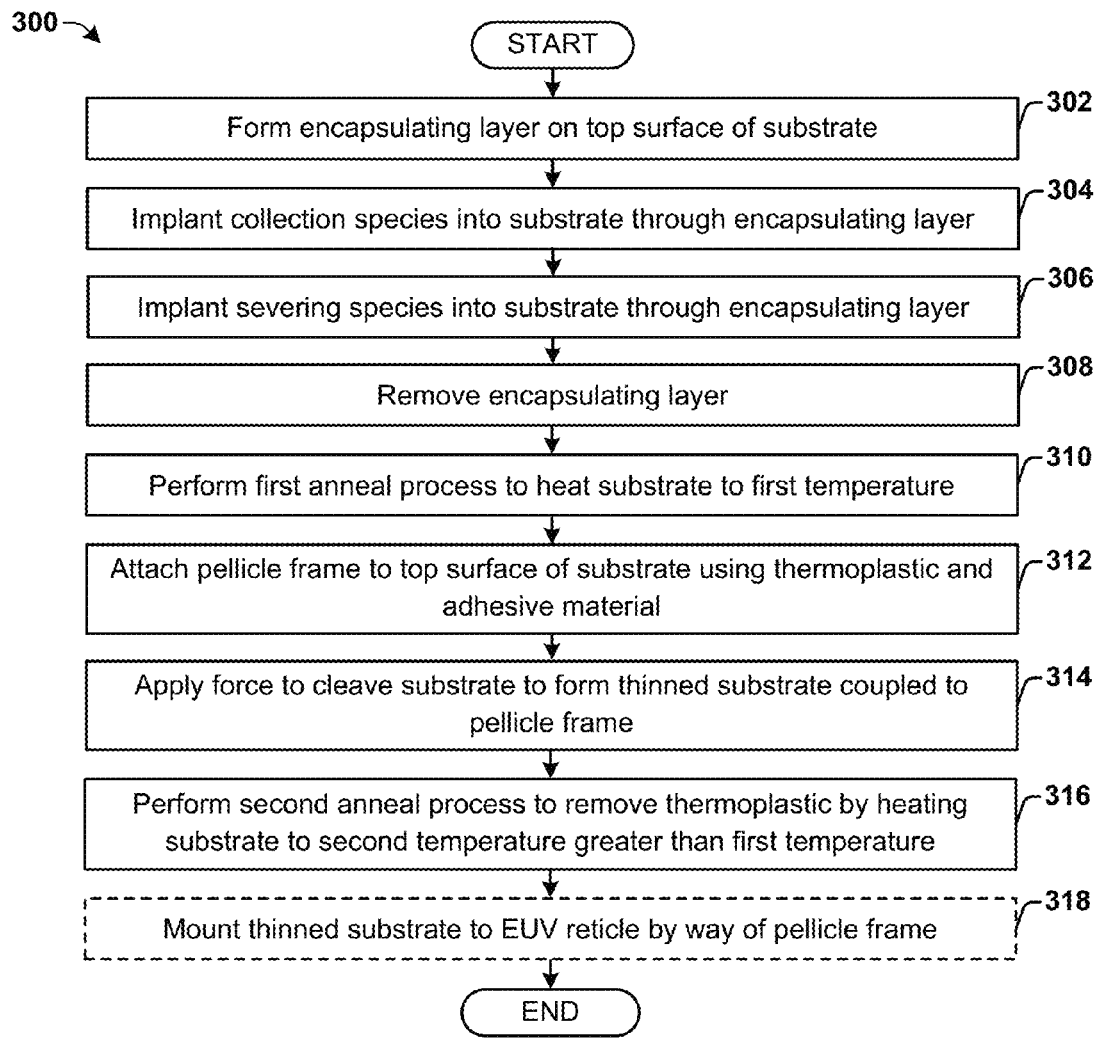
FIG. 3 is a flow diagram of some embodiments of an additional method of forming a pellicle for an EUV reticle.

FIG. 3 is a flow diagram of some embodiments of a method 300 of forming a pellicle for an EUV reticle.

At 302, an encapsulating layer is formed onto a top surface of a substrate.

At 304, a first implantation process is performed to implant a collection species into the substrate though the encapsulating layer. In some embodiments, the collection species may comprise boron.

At 306, a second implantation process is performed to implant a severing species into the substrate though the encapsulating layer. In some embodiments, the severing species may comprise hydrogen. The severing species is drawn to the collection species to weaken the structure of the substrate along a cleaving plane that is parallel to the top surface of the substrate.

At 308, the encapsulating layer is removed. In some embodiments, the encapsulating layer may be removed by exposing the encapsulating layer to an etchant.

At 310, a first anneal process is performed to heat the substrate to a first temperature. The first anneal process is configured to cause the severing species to further diffuse within the substrate to the cleaving plane. The implantation of the collection species (act 304) allows for the temperature of the first anneal process to be reduced, since the collection species concentrates the severing species along the cleaving plane.

At 312, a pellicle frame is attached to a top surface of the substrate using a thermoplastic and an adhesive material.

At 314, a force is applied to cleave the substrate along the cleaving plane and to thereby form a thinned substrate coupled to the pellicle frame.

At 316, the thermoplastic is removed by performing a second anneal process that heats the substrate to a second temperature greater than the first temperature.

At 318, the thinned substrate is mounted onto an extreme ultraviolet (EUV) reticle by way of the pellicle frame.

FIGS. 4-12 illustrate cross-sectional views corresponding to some embodiments of an exemplary method of forming a pellicle for an EUV reticle. It will be appreciated that although FIGS. 4-12 are described with respect to a method 300, the illustrated cross-sectional views are not limited such a method.

Figure 4:
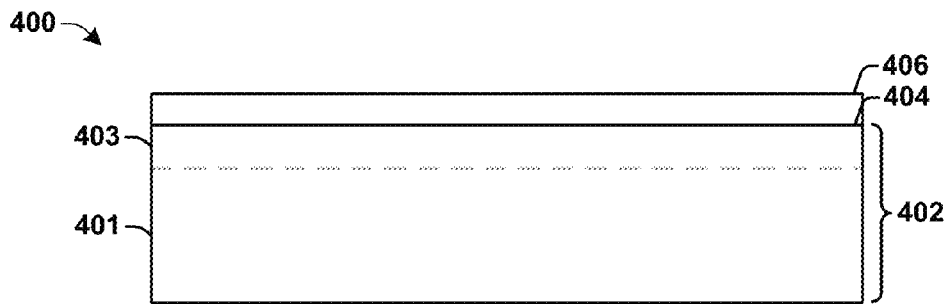
FIGS. 4-12 illustrate some embodiments of cross-sectional views corresponding to an exemplary method of forming a pellicle for an EUV reticle.

FIG. 4 illustrates a cross-sectional view 400 of some embodiments of a substrate corresponding to act 302.

As shown in cross-sectional view 400, an encapsulating layer 406 is formed onto a top surface 404 of a substrate 402. The substrate 402 has a high optical transmission rate that allows for EUV radiation to pass without substantially attenuating the amplitude of the EUV radiation. In some embodiments, the substrate 402 may comprise crystalline silicon having a homogenous crystalline framework. In other embodiments, the substrate 402 may comprise silicon carbide.

In some embodiments, the substrate 402 may comprise a material having a large Young's modulus 403 (e.g., a Young's modulus of greater than 750 GPa) disposed onto a base substrate 401 (e.g., silicon). In some embodiments, the material having a high Young's modulus 403 may comprise single-walled carbon nanotubes, graphene, or diamond, for example.

The encapsulating layer 406 may be formed on the substrate to a thickness having a range of between approximately 50 nm and approximately 300 nm. In some embodiments, the encapsulating layer 406 may comprise silicon oxide ($SiO_2$). In other embodiments, the encapsulating layer 406 may comprise a layer of silicon oxide ($SiO_2$) and an overlying layer of amorphous silicon. In yet other embodiments, the encapsulating layer 406 may comprise a layer of silicon carbide (SiC).

Figure 5:
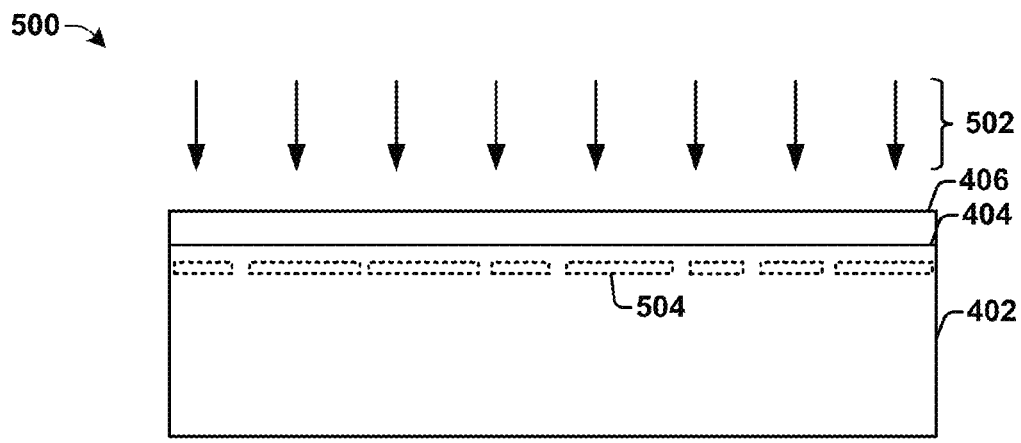

FIG. 5 illustrates a cross-sectional view 500 of some embodiments of a substrate corresponding to act 304. As shown in cross-sectional view 500, a first implantation process 502 is performed to implant a collection species 504 into the substrate 402 through the encapsulating layer 406. Implanting the collection species 504 into the substrate 402 through the encapsulating layer 406 allows for the first implantation process 502 to use a relatively high implantation energy, which provides for a more uniform depth of the collection species 504 in the substrate 402. In some embodiments, the collection species 504 may comprise boron. In some embodiments, the first implantation process 502 may implant boron into the substrate 402 at an energy of approximately 70 KeV and 100 KeV and at a dose of $5\times10^{15}$ $cm^{-3}$.

Figure 6:
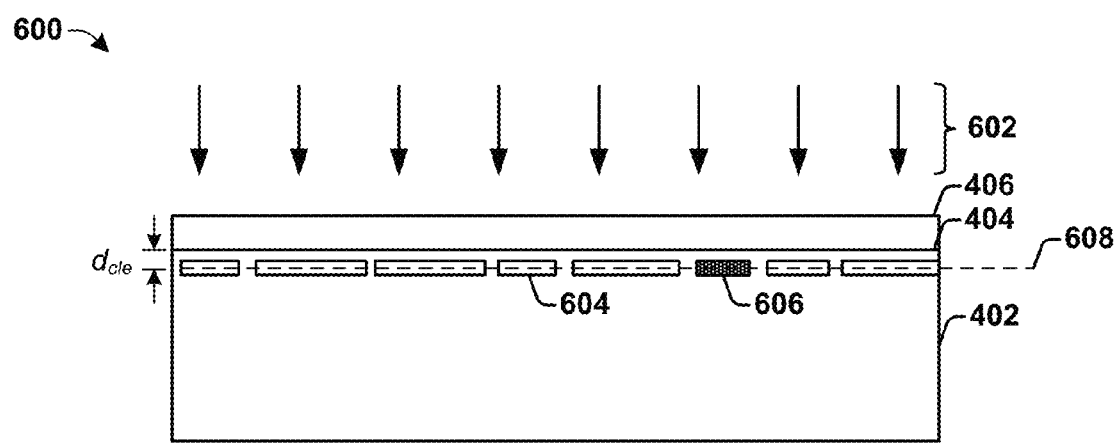

FIG. 6 illustrates a cross-sectional view 600 of some embodiments of a substrate corresponding to act 306. As shown in cross-sectional view 600, a second implantation process 602 is performed to implant a severing species, 604 and 606, into the substrate 402 through the encapsulating layer 406. The collection species 504 causes the severing species, 604 and 606, to be concentrated to have a peak concentration along a horizontal cleaving plane 608 that is parallel to the top surface 404 of the substrate 402.

In some embodiments, the severing species, 604 and 606, may comprise hydrogen. In such embodiments, the second implantation process 602 results in the formation of hydrogen molecules ($H_2$) 604 and H+ ions 606 within the substrate 402. The formation of hydrogen molecules ($H_2$) 604 in the substrate 402 weakens bonds between atoms along the cleaving plane 608. In some embodiments, the cleaving plane 608 may be located at a depth $d_{cle}$ of between approximately 50 nm and approximately 150 nm from the top surface 404 of the substrate 402. For example, in some embodiments, the second implantation process 602 may implant hydrogen into the substrate 402 at an energy of between 40 KeV and 60 KeV, to form a peak concentration that is approximately 100 nm below the top surface 404 of the substrate 402. In other embodiments, the depth $d_{cle}$ of the peak concentration may be controlled by controlling the implantation energy of the second implantation process 602 (e.g., increasing the implantation energy will increase the depth of the peak concentration).

Figure 7:
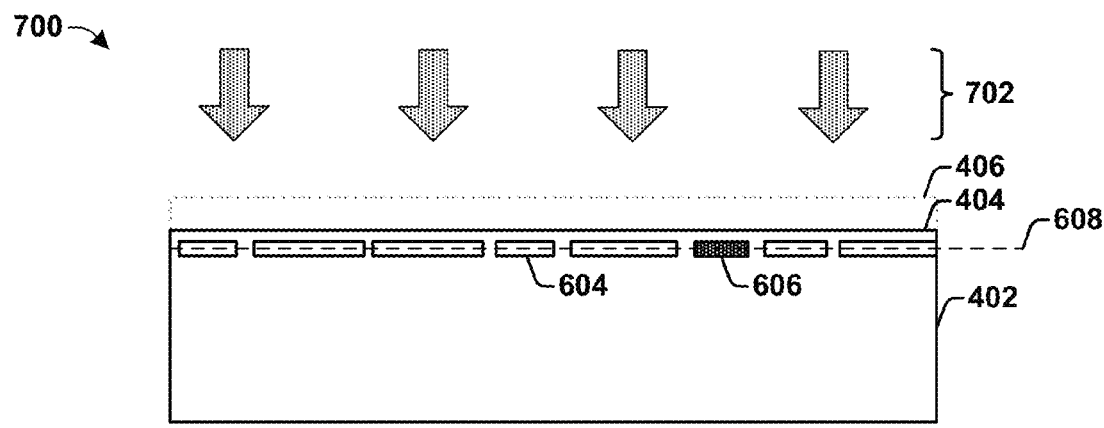

FIG. 7 illustrates a cross-sectional view 700 of some embodiments of a substrate corresponding to act 308. As shown in cross-sectional view 700, the encapsulating layer 406 is removed. In some embodiments, the encapsulating layer 406 may be removed by exposing the encapsulating layer 406 to an etchant 702. For example, an encapsulating layer 406 comprising silicon oxide ($SiO_2$) may be removed by using an etchant 702 comprising hydrofluoric (HF) acid.

Figure 8:
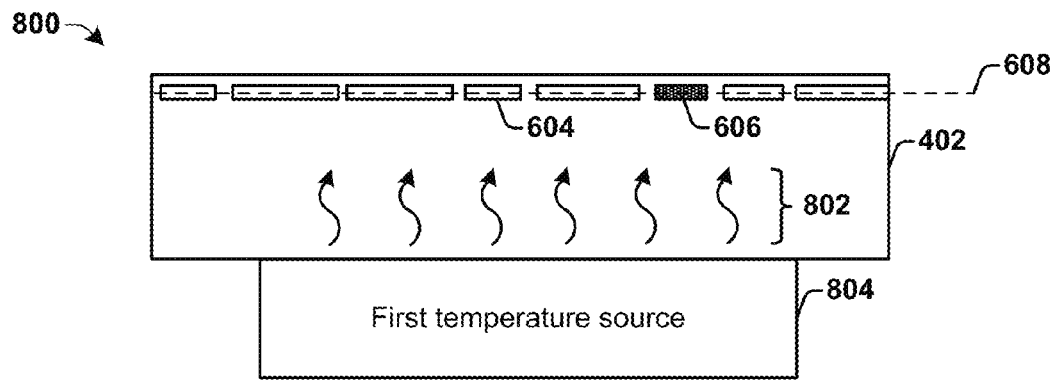

FIG. 8 illustrates a cross-sectional view 800 of some embodiments of a substrate corresponding to act 310. As shown in cross-sectional view 800, a first anneal process 802 is performed. The first anneal process 802 is performed by operating a first temperature source 804 to raise a temperature of the substrate 402 so that the severing species, 604 and 606, diffuse to the cleaving plane 608. In some embodiments, the first temperature may comprise a temperature in a range of between approximately 150° C. and approximately 200° C. By implanting the substrate 402 with the collection species 504, the temperature of the first anneal process 802 is reduced, since the collection species 504 localizes the severing species, 604 and 606, to the cleaving plane 608. Reducing the temperature of the first anneal process 802 reduces the energy provided to hydrogen molecules 604 within the substrate 402, and thereby reduces the chance of hydrogen molecules 604 exploding and damaging the top surface 404 of the substrate 402.

Figure 9:
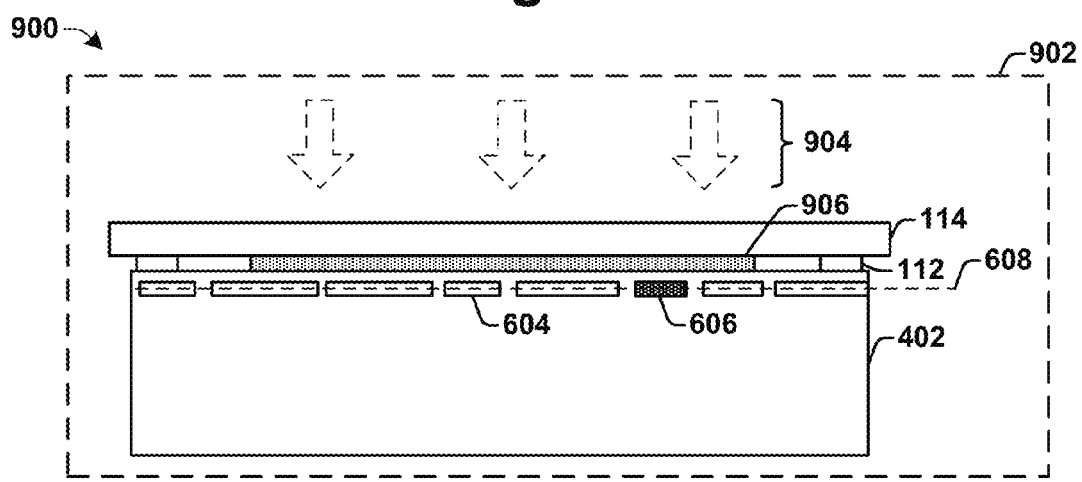

FIG. 9 illustrates a cross-sectional view 900 of some embodiments of a substrate corresponding to act 312. As shown in cross-sectional view 900, the substrate 402 is attached to a pellicle frame 114 configured to mount a thinned substrate onto an EUV reticle. In some embodiments, the pellicle frame 114 may be connected to the substrate 402 by way of a thermoplastic 906 and an adhesive material 112. For example, in some embodiments, the pellicle frame 114 is connected to the substrate 402 using an adhesive material 112 positioned along one or more edges of the substrate 402 and a thermoplastic 906 positioned along a center of the substrate 402 (i.e., between the adhesive material 908). The thermoplastic 906 is configured to increase adhesion between the pellicle frame 114 and the substrate 402. In some embodiments, the thermoplastic 906 may comprise polymethyl methacrylate (PMMA).

In some embodiments, the substrate 402 may be attached to the pellicle frame 114 in a processing chamber 902 held at an elevated pressure 904. In some embodiments, the elevated pressure 904 may comprise a pressure greater than or equal to 2 atmosphere. The elevated pressure 904 within the processing chamber 902 pushes on the substrate 402, further reducing the chance of hydrogen molecules ($H_2$) 604 within the substrate 402 exploding and damaging the top surface 404 of the substrate 402. In some embodiments, the first anneal process (act 310) may be performed within the processing chamber 902 held at the elevated pressure 904.

Figure 10:
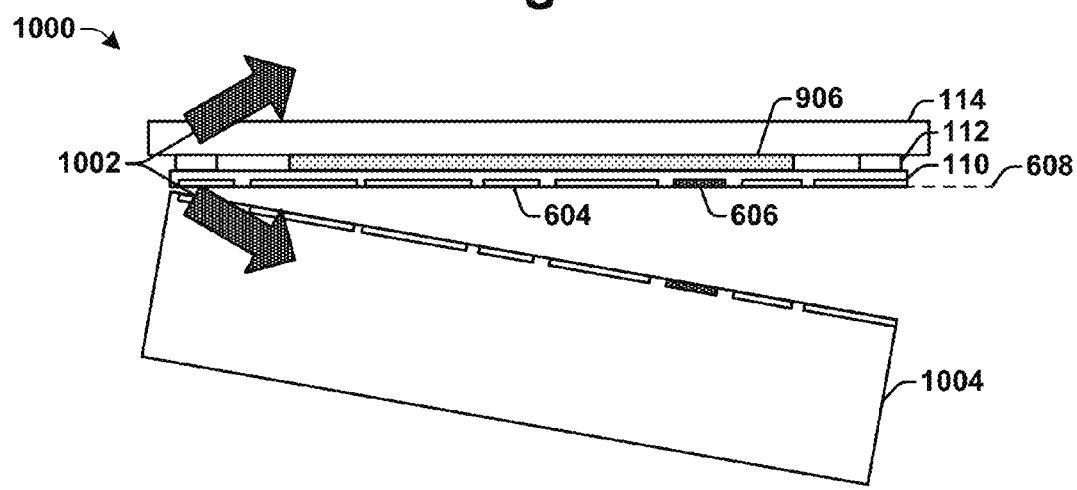

FIG. 10 illustrates a cross-sectional view 1000 of some embodiments of a substrate corresponding to act 314. As shown in cross-sectional view 1000, the substrate 402 is cleaved by applying a force 1002 to the substrate 402. Cleaving the substrate 402 will cause the substrate to break along the cleaving plane 608 comprising the $H_2$ molecules 604 and the H+ ions 606, resulting in a thinned substrate 110 and a remainder substrate 1004. In some embodiments, the thinned substrate 110 may comprise a thickness of between 50 nm and 150 nm. In some embodiments, the force 1002 may have a range of between approximately 1 atmosphere and approximately 3 atmospheres. The increased adhesion between the pellicle frame 114 and the substrate 402, provided by the thermoplastic 906, reduces damage to the thinned substrate 110 during cleaving of the substrate 402.

Figure 11:
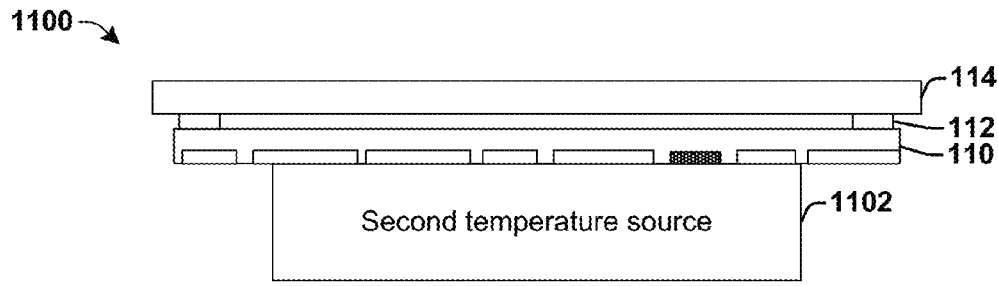

FIG. 11 illustrates a cross-sectional view 1100 of some embodiments of a substrate corresponding to act 316. As shown in cross-sectional view 1100, a second anneal process is performed. The second anneal process is performed by operating a second temperature source 1102 to raise a temperature of the substrate 402 to a second temperature that is greater than the first temperature. The second temperature removes the thermoplastic 906 from the substrate 402. In some embodiments, a solvent (e.g., argon gas) may be introduced into a processing chamber held at the second temperature, to improve removal of the thermoplastic 906 from the substrate 402. In some embodiments, the second temperature may comprise a temperature of greater than 225° C. Removal of the thermoplastic 906 leaves the adhesive material 112 between the thinned substrate 110 and the pellicle frame 114.

Figure 12:
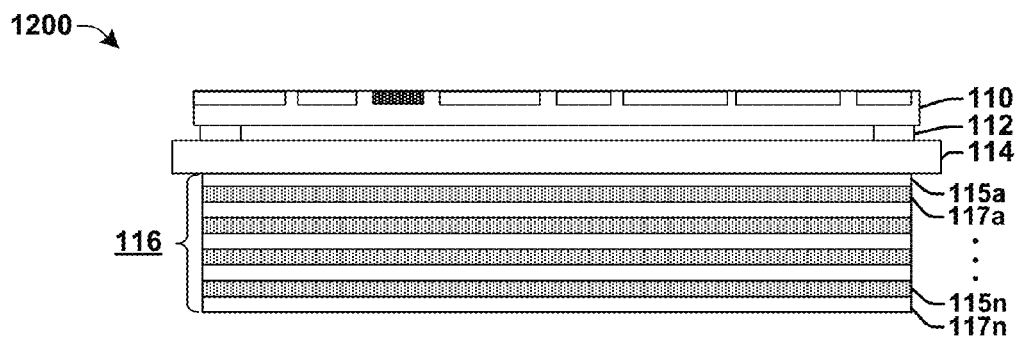

FIG. 12 illustrates a cross-sectional view 1200 of some embodiments of a substrate corresponding to act 318. As shown in cross-sectional view 1200, the thinned substrate 110 may be mounted to an extreme ultraviolet (EUV) reticle 116 by way of the pellicle frame 114. The EUV reticle 116 comprises a plurality of reflective layers 115a-115n separated by a plurality of spacer layers 117a-117n. The reflective layers 115a-115n may comprise molybdenum (Mo) or ruthenium (Ru) and the spacer layers 117a-117 may comprise silicon (Si).

Figure 13:
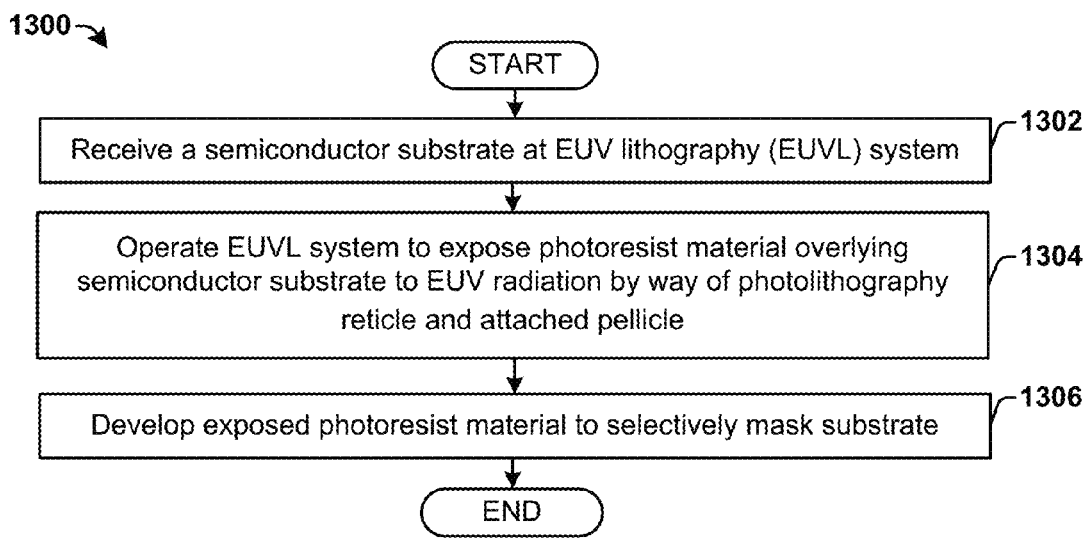
FIG. 13 is a flow diagram of some embodiments of a method for forming an integrated chip feature on a substrate using an EUV reticle having a pellicle.

FIG. 13 is a flow diagram of some embodiments of a method 1300 for forming an integrated chip feature on a substrate using an EUV reticle having a pellicle.

At 1302, a semiconductor substrate is received at an EUV lithography (EUVL) system. The semiconductor substrate may comprise any type of semiconductor body (e.g., silicon, silicon-germanium, silicon-on-insulator) such as a semiconductor wafer and/or one or more die on a wafer, as well as any other type of semiconductor and/or epitaxial layers associated therewith.

At 1304, the EUV lithography tool is operated to expose the semiconductor substrate to EUV radiation (e.g., having a wavelength of approximately 13.5 nm) by way of an EUV reticle connected to a thinned substrate by way of an adhesive material. In various embodiments, the thinned substrate may comprise crystalline silicon having a homogenous crystalline framework or a material having a high Young's modulus (e.g., greater than 750 GPa) such as single-walled carbon nanotubes (having a Young's modulus of approximately 1,000 GPa), graphene (having a Young's modulus of approximately 1,000 GPa), or diamond (having a Young's modulus of approximately 1,220 GPa). In some embodiments, the thinned substrate may comprise hydrogen and boron dopants. The hydrogen and boron dopants comprise a peak concentration disposed along a bottom surface of the thinned substrate opposing the pellicle frame. In some embodiments, the hydrogen dopants may comprise hydrogen molecules ($H_2$) and/or hydrogen ions (H+).

At 1306, the exposed photoresist material is developed. Developing the selectively exposed photoresist material removes weaker sections of the exposed photoresist material, so as to selectively expose the substrate.

Therefore, the present disclosure relates to a method of forming an extreme ultraviolet (EUV) pellicle comprising a high quality, optically transmissive pellicle film connected to a pellicle frame without a supportive mesh, and an associated apparatus.

In some embodiments, the present disclosure relates to a method for forming a pellicle. The method comprises forming a cleaving plane within a substrate, and attaching a pellicle frame to an upper surface of the substrate. The method further comprises cleaving the substrate along the cleaving plane to form a pellicle film attached to the pellicle frame.

In other embodiments, the present disclosure relates to a method for forming a pellicle. The method comprises performing a first implantation process to implant a first dopant species into an upper surface of a substrate, and performing a second implantation process to implant a second dopant species into the upper surface of the substrate. The method further comprises attaching a pellicle frame to the upper surface of the substrate after performing the second implantation process, and cleaving the substrate to form a thinned substrate attached to the pellicle frame.

In yet other embodiments, the present disclosure relates to an extreme ultraviolet (EUV) pellicle. The EUV pellicle comprises a thinned substrate having a first surface comprising a first dopant species and a second dopant species that is different than the first dopant species. The EUV pellicle further comprises a pellicle frame connected to outer edges of a second surface of the thinned substrate and configured to mount the thinned substrate to an extreme ultraviolet (EUV) reticle. The first surface and the second surface face opposite directions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a pellicle, comprising:
forming a cleaving plane within a substrate;
attaching a pellicle frame to an upper surface of the substrate; and
cleaving the substrate along the cleaving plane to form a pellicle film attached to the pellicle frame.

2. The method of claim 1, further comprising:
operating upon the substrate, prior to cleaving the substrate, to reduce structural damage to the upper surface of the substrate during formation of the cleaving plane or during cleaving the substrate.

3. The method of claim 1, further comprising:
performing a first implantation process to implant a collection species into the upper surface of the substrate; and
performing a second implantation process to implant a severing species into the upper surface of the substrate, wherein the collection species causes the severing species to achieve a peak concentration along the cleaving plane.

4. The method of claim 3,
wherein the first implantation process is configured to implant boron into the substrate at a first energy; and
wherein the second implantation process is configured to implant hydrogen into the substrate at a second energy different than the first energy.

5. The method of claim 3, further comprising:
forming an encapsulating layer on the upper surface of the substrate prior to performing the first implantation process and the second implantation process; and
removing the encapsulating layer after performing the first implantation process and the second implantation process.

6. The method of claim 5, wherein the encapsulating layer comprises an oxide.

7. The method of claim 5, wherein the encapsulating layer comprises silicon carbide or a layer of silicon oxide and an overlying layer of amorphous silicon.

8. The method of claim 1, further comprising:
attaching the pellicle frame to the upper surface of the substrate using a temporary adhesive material and a perdurable adhesive material different than the temporary adhesive material.

9. The method of claim 8, wherein the temporary adhesive material comprises polymethyl methacrylate (PMMA).

10. The method of claim 1, further comprising:
performing a first anneal process on the substrate to raise a temperature of the substrate to a first temperature prior to cleaving the substrate; and
performing a second anneal process on the substrate to raise the temperature of the substrate to a second temperature greater than the first temperature after cleaving the substrate.

11. The method of claim 1, wherein the substrate comprises a layer of graphene, silicon carbide, or single walled carbon nanotubes disposed onto a base substrate.

12. The method of claim 1, further comprising:
mounting the pellicle film to an extreme ultraviolet (EUV) reticle by way of the pellicle frame.

13. A method for forming a pellicle, comprising:
performing a first implantation process to implant a first dopant species into an upper surface of a substrate;
performing a second implantation process to implant a second dopant species into the upper surface of the substrate;
attaching a pellicle frame to the upper surface of the substrate after performing the second implantation process; and
cleaving the substrate to form a thinned substrate attached to the pellicle frame.

14. The method of claim 13,
wherein the first dopant species causes the second dopant species to achieve a peak concentration along a cleaving plane; and
wherein the substrate is cleaved along the cleaving plane.

15. The method of claim 13, further comprising:
forming an encapsulating layer on the upper surface of the substrate prior to performing the first implantation process and the second implantation process; and
removing the encapsulating layer after performing the first implantation process and the second implantation process.

16. The method of claim 13, further comprising:
attaching the pellicle frame to the upper surface of the substrate using a temporary adhesive material and a perdurable adhesive material different than the temporary adhesive material.

17. An extreme ultraviolet (EUV) pellicle, comprising:
a thinned substrate having a first surface comprising a first dopant species and a second dopant species that is different than the first dopant species; and
a pellicle frame connected to outer edges of a second surface of the thinned substrate and configured to mount the thinned substrate to an extreme ultraviolet (EUV) reticle, wherein the first surface and the second surface face opposite directions.

18. The EUV pellicle of claim 17, further comprising:
an adhesive material disposed onto outer edges of the second surface of the thinned substrate and configured to connect the pellicle frame to the thinned substrate.

19. The EUV pellicle of claim 17, wherein the first dopant species comprises hydrogen and the second dopant species comprises boron.

20. The EUV pellicle of claim 17, wherein the substrate comprises silicon.

* * * * *